United States Patent [19]
Yamada et al.

[11] Patent Number: 5,223,726
[45] Date of Patent: Jun. 29, 1993

[54] SEMICONDUCTOR DEVICE FOR CHARGE TRANSFER DEVICE

[75] Inventors: Takahiro Yamada, Hirakata; Sumio Terakawa, Ibaraki, both of Japan

[73] Assignee: Matsushita Electric Industrial Co., Ltd., Osaka, Japan

[21] Appl. No.: 821,286

[22] Filed: Jan. 10, 1992

Related U.S. Application Data

[63] Continuation of Ser. No. 556,331, Jul. 23, 1990, abandoned.

[30] Foreign Application Priority Data

Jul. 25, 1989 [JP] Japan .................... 1-192959

[51] Int. Cl.$^5$ ............... H01L 29/78; H01L 27/14; H01L 31/00
[52] U.S. Cl. .................... 257/244; 257/216; 257/222; 257/232; 257/233; 257/249
[58] Field of Search ............ 357/24, 24 LR, 24 M; 257/216, 244, 249, 222, 232, 233

[56] References Cited

U.S. PATENT DOCUMENTS

| | | | |
|---|---|---|---|
| 3,848,328 | 11/1974 | Ando et al. | 357/24 |
| 4,760,273 | 7/1988 | Kimata | 357/24 LR |
| 4,884,142 | 11/1989 | Suzuki | 357/24 LR |
| 4,926,225 | 5/1990 | Hosack | 357/24 LR |

FOREIGN PATENT DOCUMENTS

| | | | |
|---|---|---|---|
| 0239151A1 | 9/1987 | European Pat. Off. | |
| 53-85185 | 7/1978 | Japan | 357/24 |
| 55-1136 | 1/1980 | Japan | 357/24 |
| 56-13769 | 2/1981 | Japan | 357/24 |
| 58-46871 | 10/1983 | Japan | 357/24 |
| 60-262461 | 12/1985 | Japan | |
| 61-174765 | 8/1986 | Japan | |
| 63-12162 | 1/1988 | Japan | 357/24 |
| 63-69263 | 3/1988 | Japan | |

OTHER PUBLICATIONS

"Charge Transfer Devices"; Carlo H. Sequin et al.; pp. 6–18; 42–47; 152–157.
"Trench CCD Image Sensor"; Takahiro Yamada et al.; pp. 1–8.
IEEE 1989 International Conference on Consumer Electronics, Rosement, Ill., 6th–9th Jun. 1989, pp. 176–177, New York, U.S.; T. Yamada et al.: "Trench CCD image sensor for high resolution cameras".

*Primary Examiner*—Andrew J. James
*Assistant Examiner*—Ngan Van Ngo
*Attorney, Agent, or Firm*—Wenderoth, Lind & Ponack

[57] ABSTRACT

In a CCD device, a plurality of trench holes are formed in high resistivity semiconductor layer and juxtaposed in a charge transfer direction, and charge transfer electrodes are buried in the trench holes. Charge transfer regions are formed in the semiconductor layer around the vicinity of the respective trench holes during a main operating state.

3 Claims, 16 Drawing Sheets

SEMICONDUCTOR DEVICE FOR CHARGE TRANSFER DEVICE

This application is a continuation of now abandoned application Ser. No. 07/556,331 filed on Jul. 23, 1990.

BACKGROUND OF THE INVENTION

1. Field of the Invention

The present invention relates to a semiconductor device, and more particularly, to a structure of a charge transfer device.

2. Description of the Prior Art

A conventional example of a charge coupled type or CCD type image pick-up device is disclosed in C. H. Sequin, M. F. Tompsett "Charge Transfer Device" published by Academic Press New York, N.Y. 1975. Such a C.C.D. type image pick-up device includes, as shown in FIG. 1(a), a light receiving part 403 consisting of a photoelectric conversion region 401 and a vertical CCD region 402, a horizontal CCD part 404 and an output amplifier 405. The light receiving part 403 is shown in FIG. 1(b) in which an $n^+$ region 407 formed on a surface of a P substrate 406 constitutes the photoelectric conversion region 401 of a p-n junction type photodiode, while the $n^-$ region 408 having a high resistivity constitutes the vertical CCD region 402 in association with transferring gate electrode 409. In attempting to make the device high in resolution by increasing the device density while maintaining the size of the area of the device as it is, (that is maintaining the optical lens system as it is), it is necessary to divide one area of one picture element or one pixel into the photoelectric conversion region 401 and the vertical CCD region 402. Since the size occupied by the photoelectric conversion region 402 (which is called as opening rate) defines the sensitivity and the size of the vertical CCD region 402, relates to the width of the charge transferring channel and defines the dynamic range, there occurs a trade off between sensitivity and dynamic range.

As a result of study of dissolving the above problem, the present inventors have found that it is possible to enlarge the effective channel width of the CCD device in such a manner that there constitutes a three dimensional trench 502 or recess in the form of a groove in the vertical CCD region 402 as shown in FIG. 2 (disclosed in the Japanese Patent Publication (unexamined) 63-12162). More specifically, an elongated trench groove 502 is formed in a substrate 501 of a P conductivity type so as to extend in one direction and an n conductivity region 503 acting as a buried channel region is formed on the surface of the trench groove 502. Thereafter, a number of first transfer electrodes 505 are formed on the surface of the trench groove 502 which are isolated by insulation layers 504 and a number of second transfer electrodes 507 are formed on the surface of the trench groove 502 which are isolated by insulation layers 506. By the arrangement mentioned as above, since the area occupied by the vertical CCD region per one pixel can be decreased, the size of the photoelectric conversion region 401 can be increased, thereby resulting in an improved sensitivity of the CCD image pick-up device. In addition, in the vertical CCD unit 402, the dynamic range can be improved by increasing the effective channel width of the transfer channel by increasing the depth of the trench groove 502. (reference literature: T. YAMADA etal, "TRENCH CCD IMAGESENSOR" IEEE 1989, International Conference on Consumer Electronics, pp 178–179, June 1989).

However, there is a specific problem of constituting the trench groove in the CCD device. Namely, the transfer electrodes 505 as shown in FIG. 2 are formed by processes of uniformly forming a poly silicon layer, on the wall surface of the trench groove and then removing unnecessary portions of the layer by etching. The difficulty of completing the transfer electrodes increases as the depth of the trench groove increases.

The CCD device with the trench groove has two kinds of transfer electrodes 505 and 507 similar to the conventional CCD device. Therefore, it is necessary to repeat the etching process twice, and it is absolutely necessary to prepare protection film for proofing the damage of the semiconductor portion due to long time duration of the etching process, whereby the resultant burden in the production process is not negligible.

SUMMARY OF THE INVENTION

An essential object of the present invention is to provide a semiconductor device having a trench structure with improved sensitivity and dynamic range without poly silicon work in the trench groove.

In order to accomplish the object mentioned above, according to the present invention there is provided a semiconductor device including a CCD device having first charge transferring regions formed in such a manner that a plurality of trench holes are juxtaposed in the charge transferring direction and charge transferring electrodes are buried in the respective trench holes which are isolated by insulation layers, thereby the first charge transferring region is formed on the peripheral portion of each of the trench hole and second charge transferring regions is formed between the respective trench holes on the surface of the CCD device.

According to the present invention, the trench is formed in a form of juxtaposed holes, any etching process for forming charge transferring electrodes in the trench is unnecessary, whereby it becomes possible to form the electrodes independent of the depth of the trench, and simplifying the structure and manufacturing process the CCD device.

BRIEF EXPLANATION OF THE DRAWINGS

FIG. 3(a) is a plan view of the first embodiment of the CCD device according to the present invention, FIG. 3(p) is a cross sectional view taken along the lines P—P' in FIG. 3(n), FIGS. 4(a) to 4(f) show a further embodiment of the image pick up device according to the present invention:

DETAILED DESCRIPTION OF THE PREFERRED EMBODIMENTS

Figure 1A:
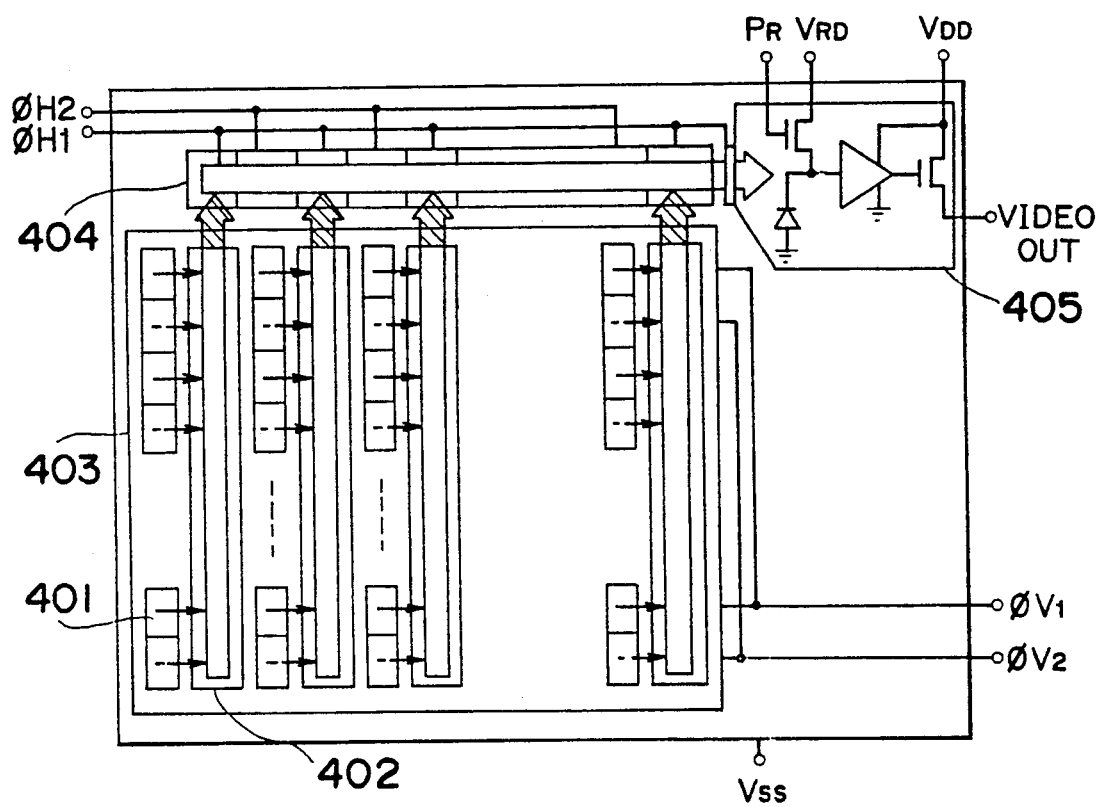
FIG. 1(a) is a block diagram showing an example of a conventional image pick up device using a CCD device.
Figure 1B:
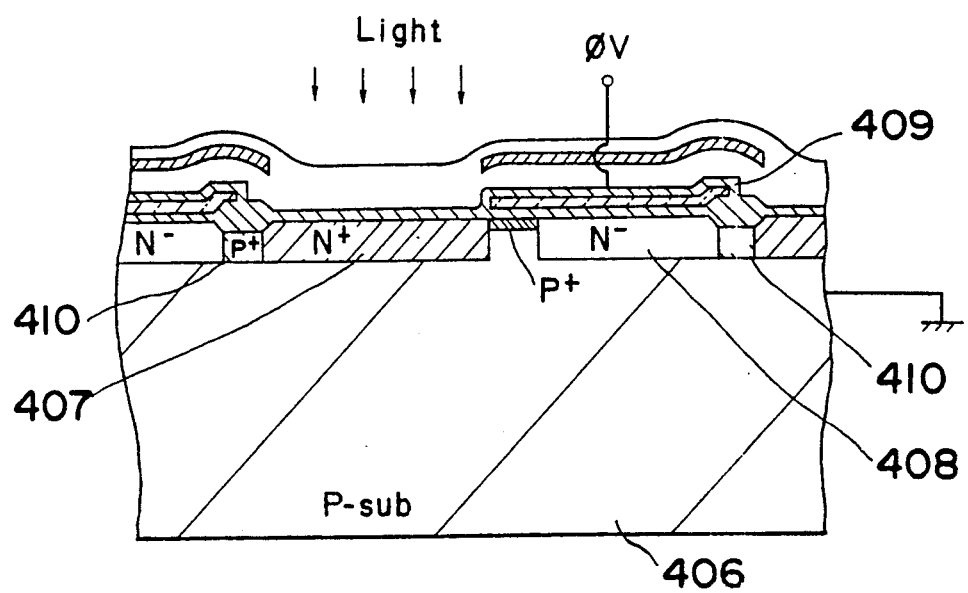
FIG. 1(b) is a cross sectional view of an essential portion of the device shown in FIG. 1(a)
Figure 2:
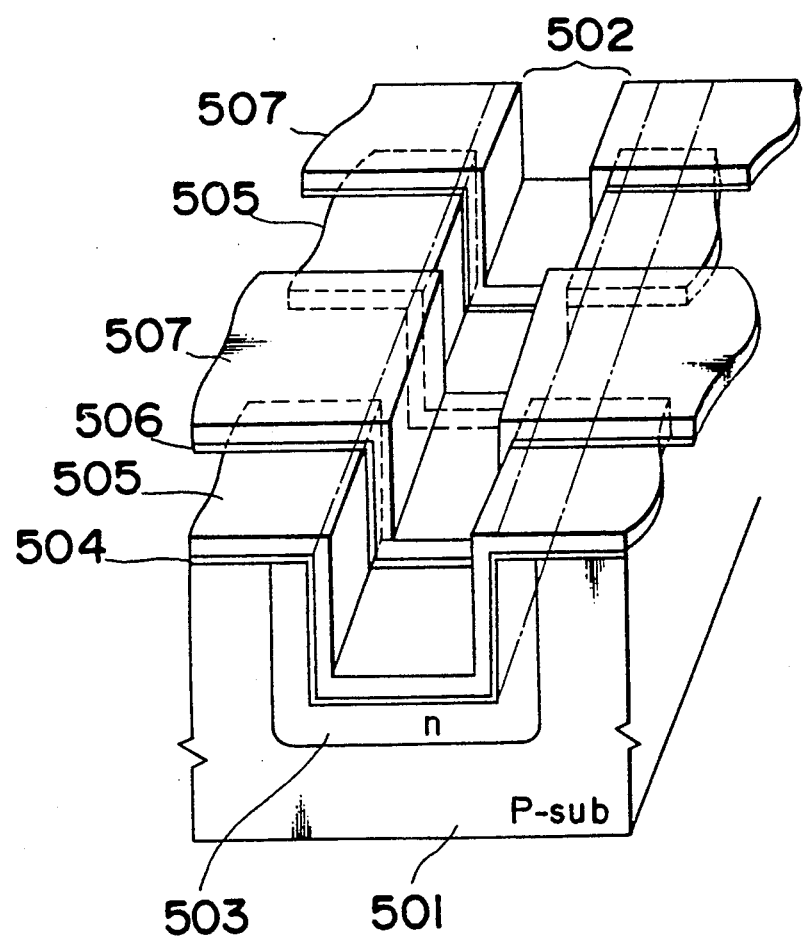
FIG. 2 is a perspective view of a part of a trench type CCD device.

Referring to FIG. 3(a) to FIG. 3(e), there is shown a substrate 101 of a p conductivity type semiconductor on which a high resistivity region 102 of an n conductivity type is formed. A plurality of holes 103 (referred to as trench holes hereinafter) are defined in the high resistivity region 102 from the surface thereof each having a length L, width W and depth D. It is noted that the opening window of the hole defined by L and W is referred to as an aperture and the sizes L and W are referred to as an aperture size. There are formed a plurality of first electrodes 105 and a plurality of second electrodes 106, each of which are isolated by insulation films 104. Each of the electrodes 105 and 106 is made of polysilicon which is buried in the trenches holes 103. Reference numerals 107 and 108 show charge transfer channels which are developed in the high resistivity region 102 around the trench holes 103 under a main operating condition, which is a condition in which necessary voltages are applied to the device so that the device shown in the drawings can act as a CCD device.

Operation of the semiconductor device constructed as described above is explained.

Figure 3A:
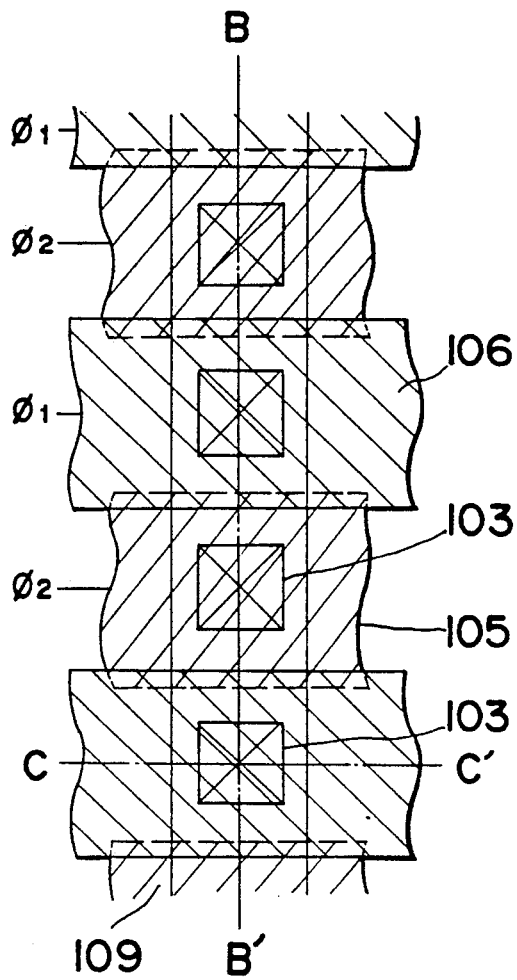
FIGS. 3(a) to 3(p) are related to the first embodiment of the semiconductor device according to the present invention.
Figure 3B:
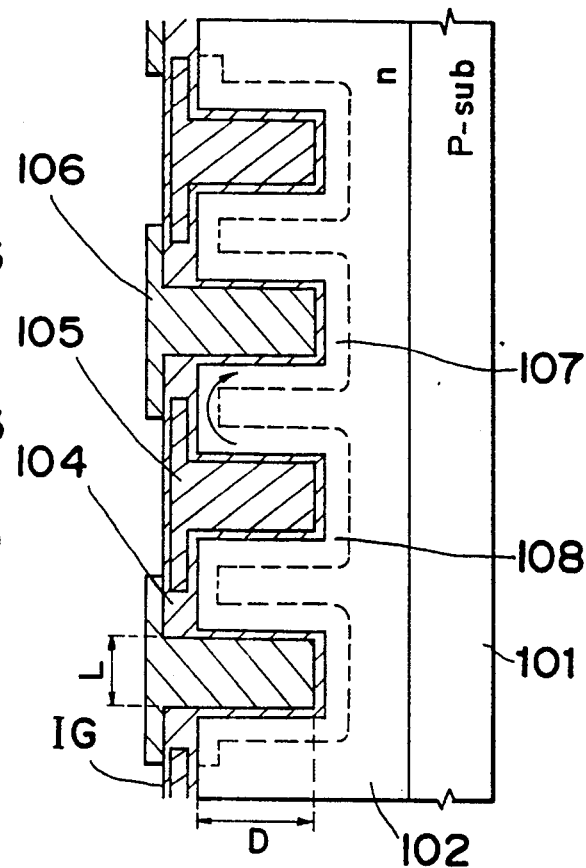
FIG. 3(b) is a cross sectional view taken along the lines B—B' in FIG. 3(a)
Figure 3C:
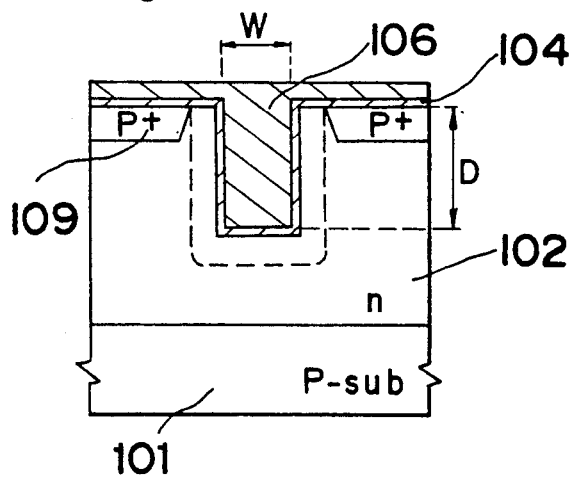
FIG. 3(c) is a cross sectional view taken along the lines C—C' in FIG. 3(a)
Figure 3D:
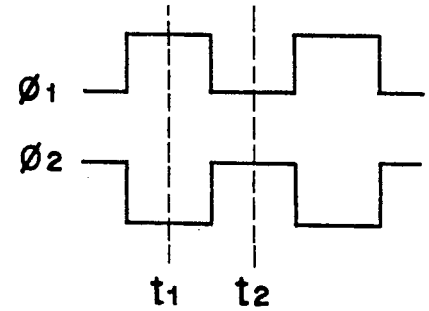
FIG. 3(d) shows a waveform of pulses used for the device shown in FIG. 3(a)

Two phases drive pulses φ1 and φ2 of complementary phase as shown in FIG. 3(d) are applied to the first electrode 105 and the second electrode 106, whereby when the pulses φ1 and φ2 shift with the time shift from t1 to t2, the signal charge is transferred in a direction from the charge transfer channel 108 to the charge transfer channel 107 as shown by the arrow of FIG. 3(b). By repeating this operation, the charge transfer can be performed in the direction which the trench holes 103 are arranged.

Figure 3E:
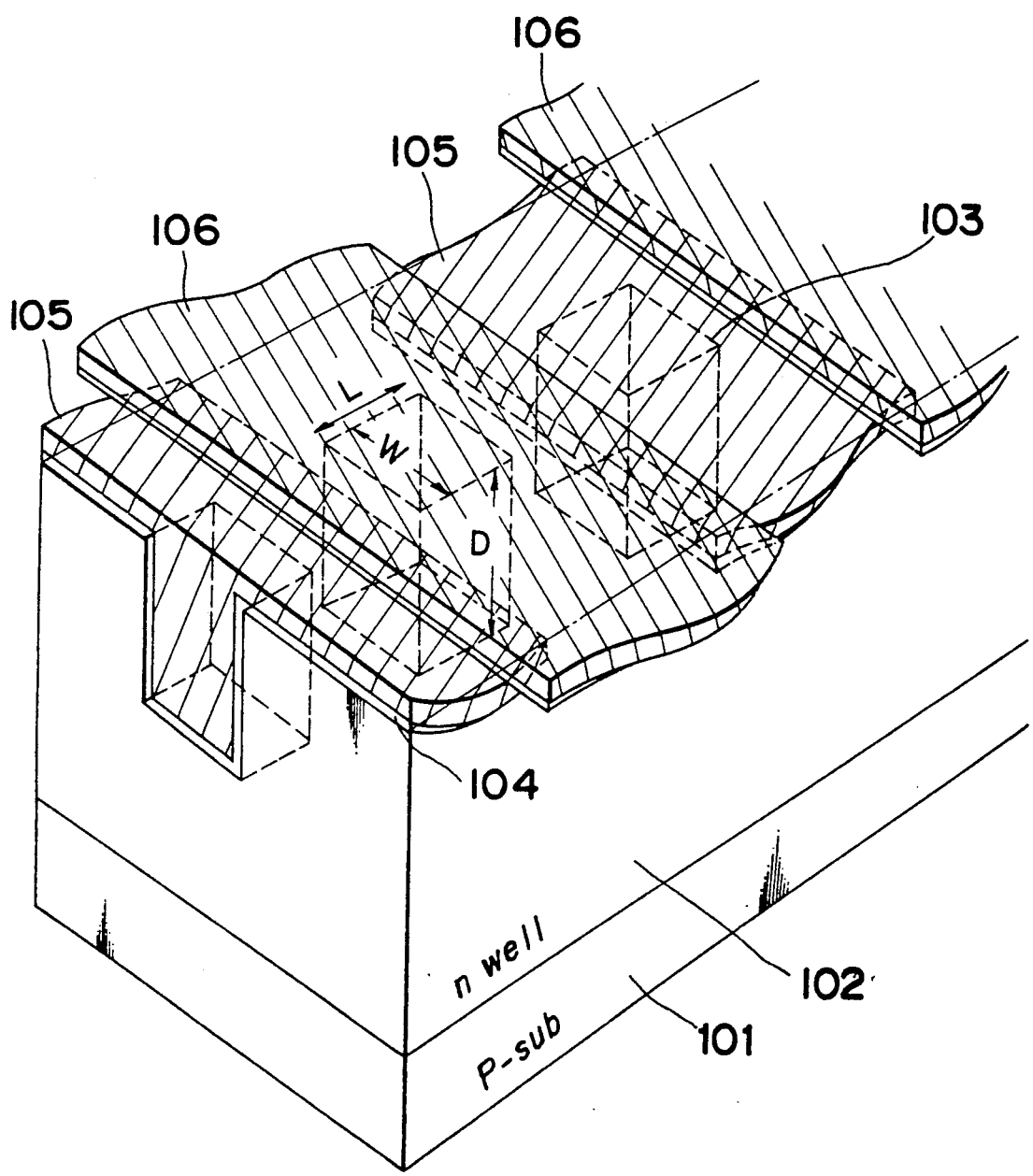
FIG. 3(e) is a perspective view of the device shown in FIG. 3(a)

A specific example of the CCD device according to the present invention is shown in FIG. 3(e), and it is shown that only one kind of polysilicon electrodes are buried in the trench hole 103.

According to the embodiment mentioned as above, there are arranged the trench holes 103 in the direction of transfer of the charge, making the respective electrodes buried in the trench holes 103 as the charge transfer electrodes, whereby it is possible to realize a device structure and production process which are independent of the depth of the trench holes formed around the trench holes 103. As the result, it becomes possible to freely select the depth of the trench hole which defines the dynamic range of the charge transfer channel, thereby facilitating the design work of the CCD device.

There may be employed various modifications and changes in the structure and operation of the embodiment described above without departing from the technical scope of the present invention.

Figure 3F:
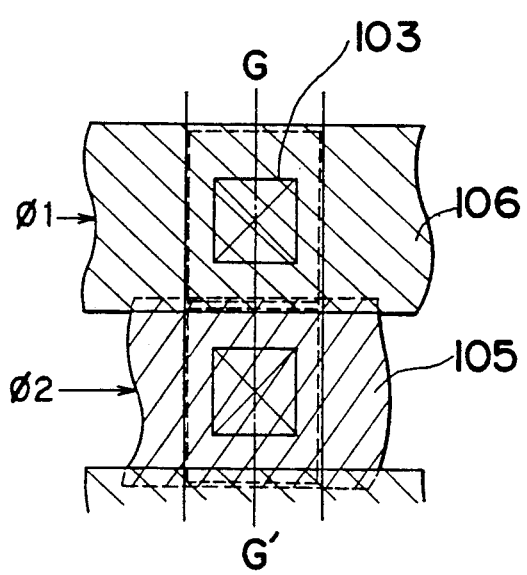
FIG. 3(f) is partial plan view of FIG. 3(a)
Figure 3G:
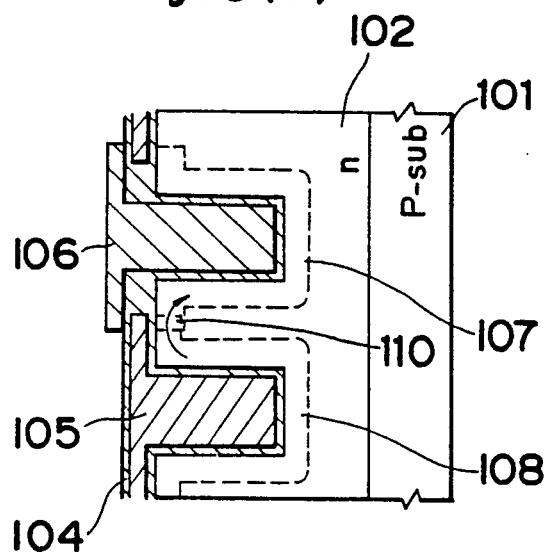
FIG. 3(g) is a cross sectional view taken along the lines G—G' in FIG. 3(f)
Figure 3H:
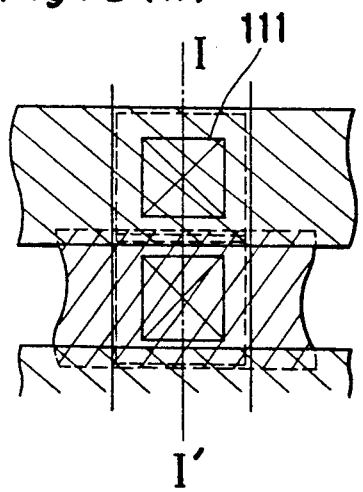
FIG. 3(h) is a partial plan view of a modification of the embodiment shown in FIG. 3(a)
Figure 3I:
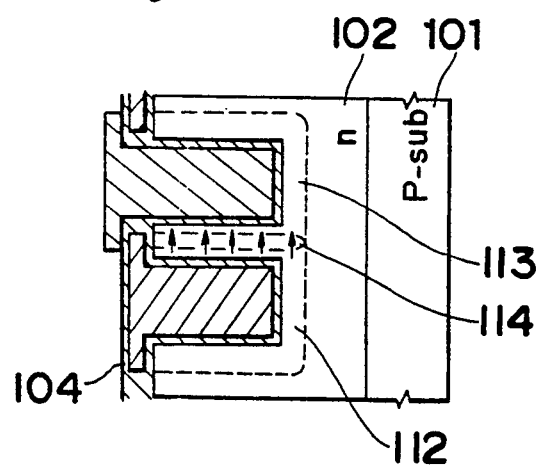
FIG. 3(i) is a cross sectional view taken along the lines I—I' in FIG. 3(h)

Referring to FIGS. 3(f) and 3(g), which are derived from FIGS. 3(a) and 3(b), the charge transfer is made through connection parts 110 of the adjacent charge transfer channels as shown by the arrow of FIG. 3(g). On the other hand, when the distance between the two adjacent trench holes 111 is small as shown in FIGS. 3(h) and 3(i), charge transfer may be made through the transfer channels 112 and 113, whereby surface charge transfer can be performed through the wider channel 114 as shown by the arrows of FIG. 3(i).

Figure 3J:
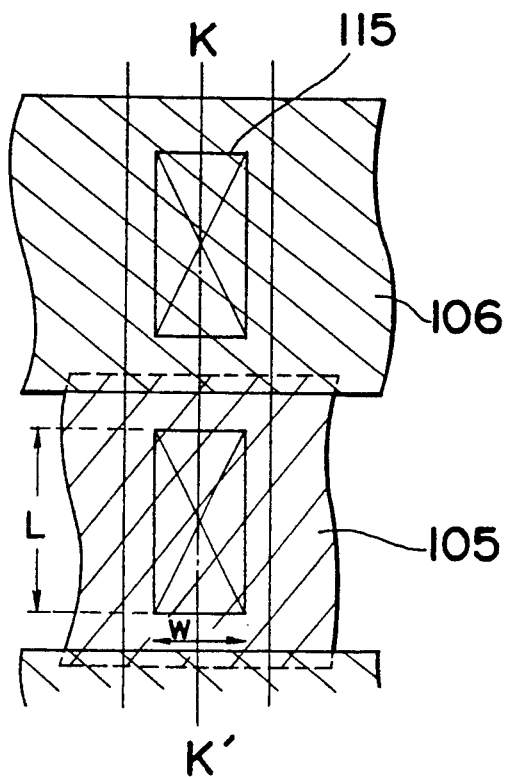
FIG. 3(j) is a plan view of a modification of the embodiment shown in FIG. 3(a)
Figure 3K:
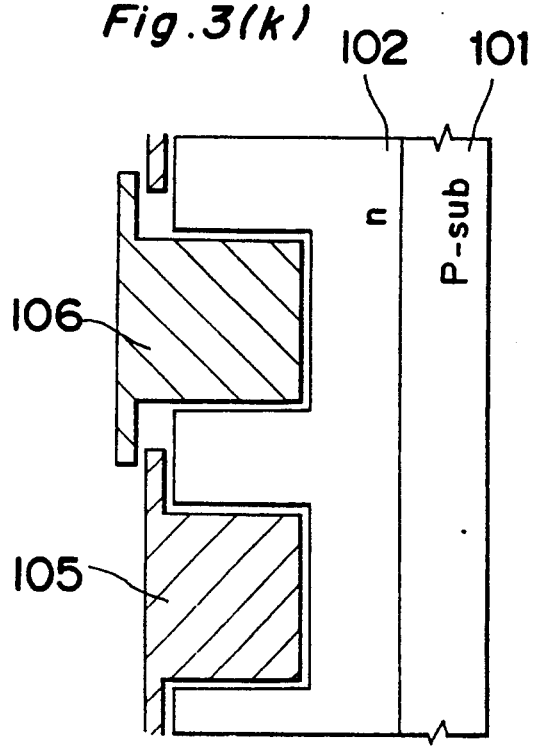
FIG. 3(k) is a cross sectional view taken along the lines K—K' in FIG. 3(j)

In the example shown in FIGS. 3(j) and 3(k), a case is depicted in which the size L of the window of the trench hole 115 is larger than the size W.

Figure 3L:
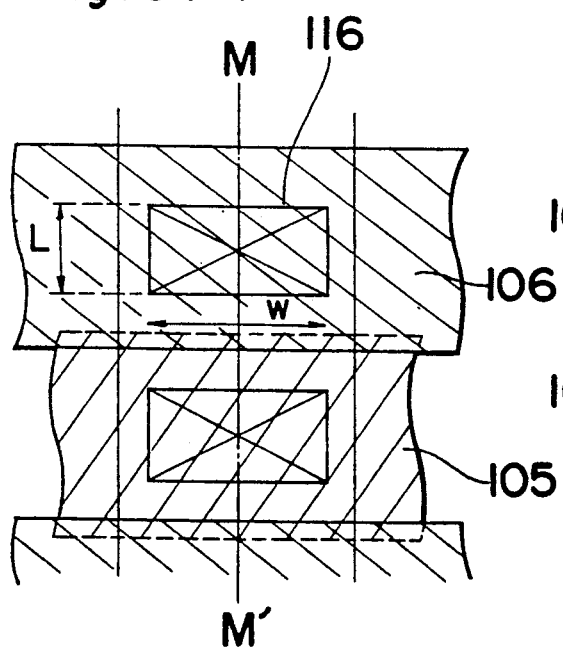
FIG. 3(l) is a plan views of a modification of the embodiment shown in FIG. 3(a)
Figure 3M:
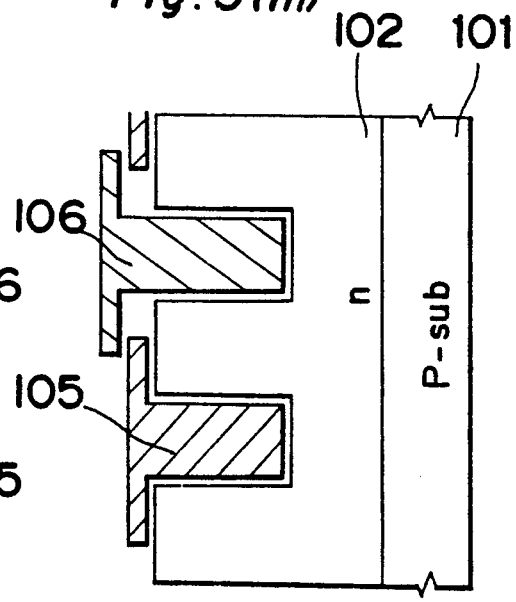
FIG. 3(m) is a cross sectional view taken along the lines M—M' in FIG. 3(l)

FIGS. 3(l) and 3(m) depict such a case in which the size L of the window of the trench hole 116 is smaller than the size W.

Figure 3N:
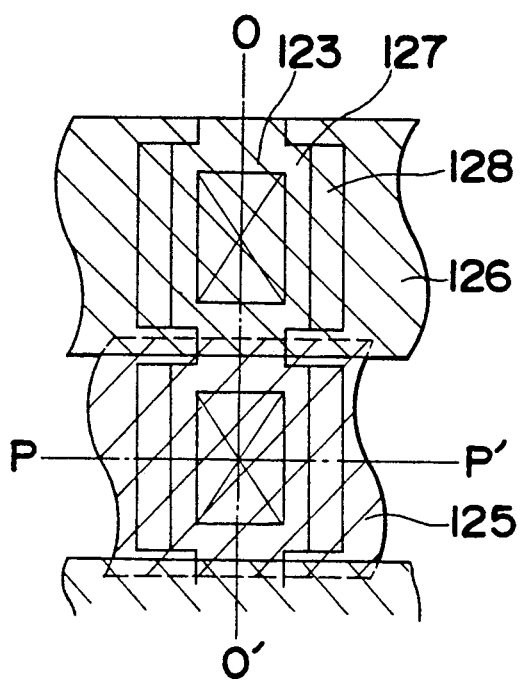
FIG. 3(n) is a plan view of a modification of the embodiment shown in FIG. 3(a)
Figure 3O:
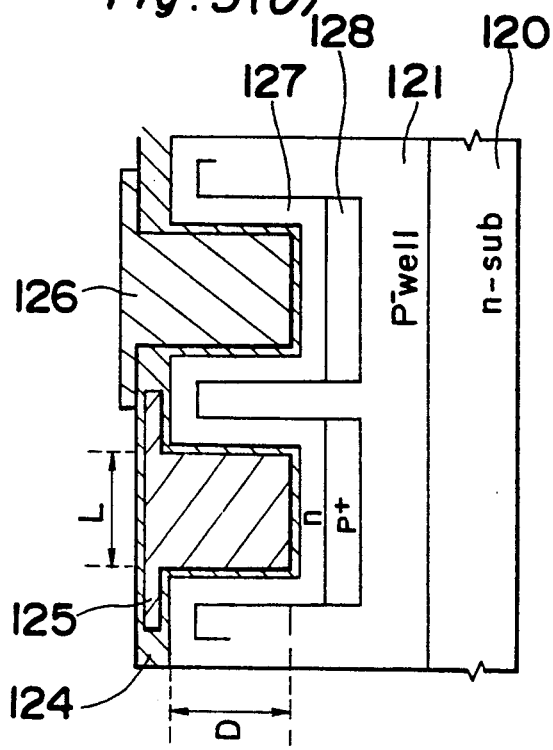
FIG. 3(o) is a cross sectional view taken along the lines O—O' in FIG. 3(n)
Figure 3P:
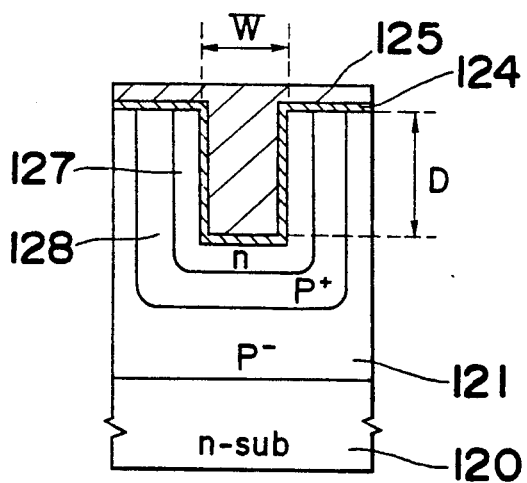

FIGS. 3(n), 3(o), 3(p) show a further modification in which the trench holes 123 are formed in the semiconductor region 121 of which conductivity type is reversed relative to the conductivity type of the semiconductor region for the trench holes 103 in the example shown in FIGS. 3(a), 3(b), 3(c). In FIGS. 3(n), 3(o), 3(p), there is formed the P conductivity type semiconductor region 121 of a high resistivity region on a n conductivity type semiconductor substrate 120 and each trench hole 123 defined in the high resistivity region 121 from the surface thereof with the size L and W and first and second electrodes 125 and 126 made of polysilicon are formed in the trench holes 123 through an insulation film 124.

An n conductivity type high resistivity region 127 is formed in the high resistivity region 121 around each trench hole 123, in addition, outside the region 127 a low resistivity region 128 of p+ conductivity is formed as a channel stop.

Figure 4A:
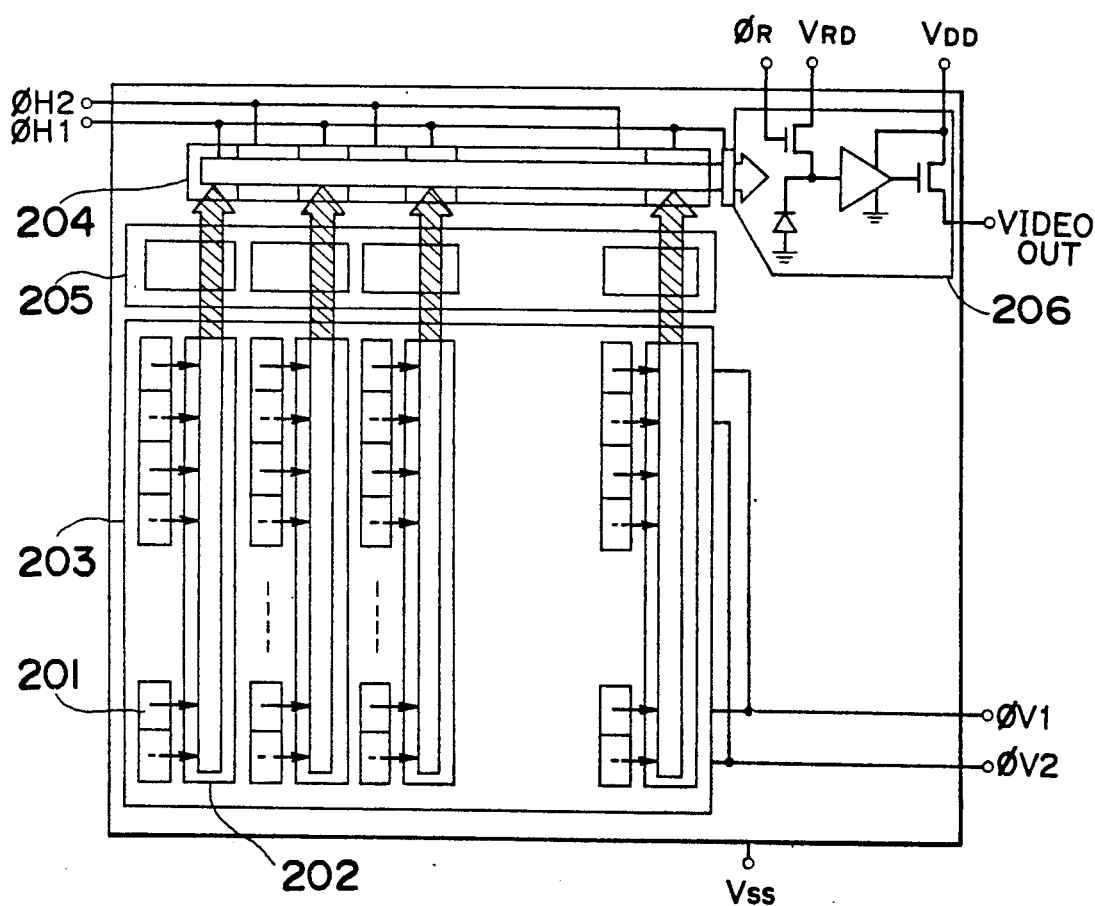
FIG. 4(a) is a block diagram of the image pick up device according to the present invention.

Referring to FIG. 4(a), showing a structure of an embodiment of the image pick up device according to the present invention, there are provided a light receiving region 203 comprising a photoelectric conversion region 201 and a vertical CCD region 202, a horizontal CCD part 204, a charge storing part 205 used as the vertical to horizontal conversion part and an output amplifier 206. The CCD device having the charge storing part is called an FIT type CCD device (frame interline transfer type CCD device).

Figure 4B:
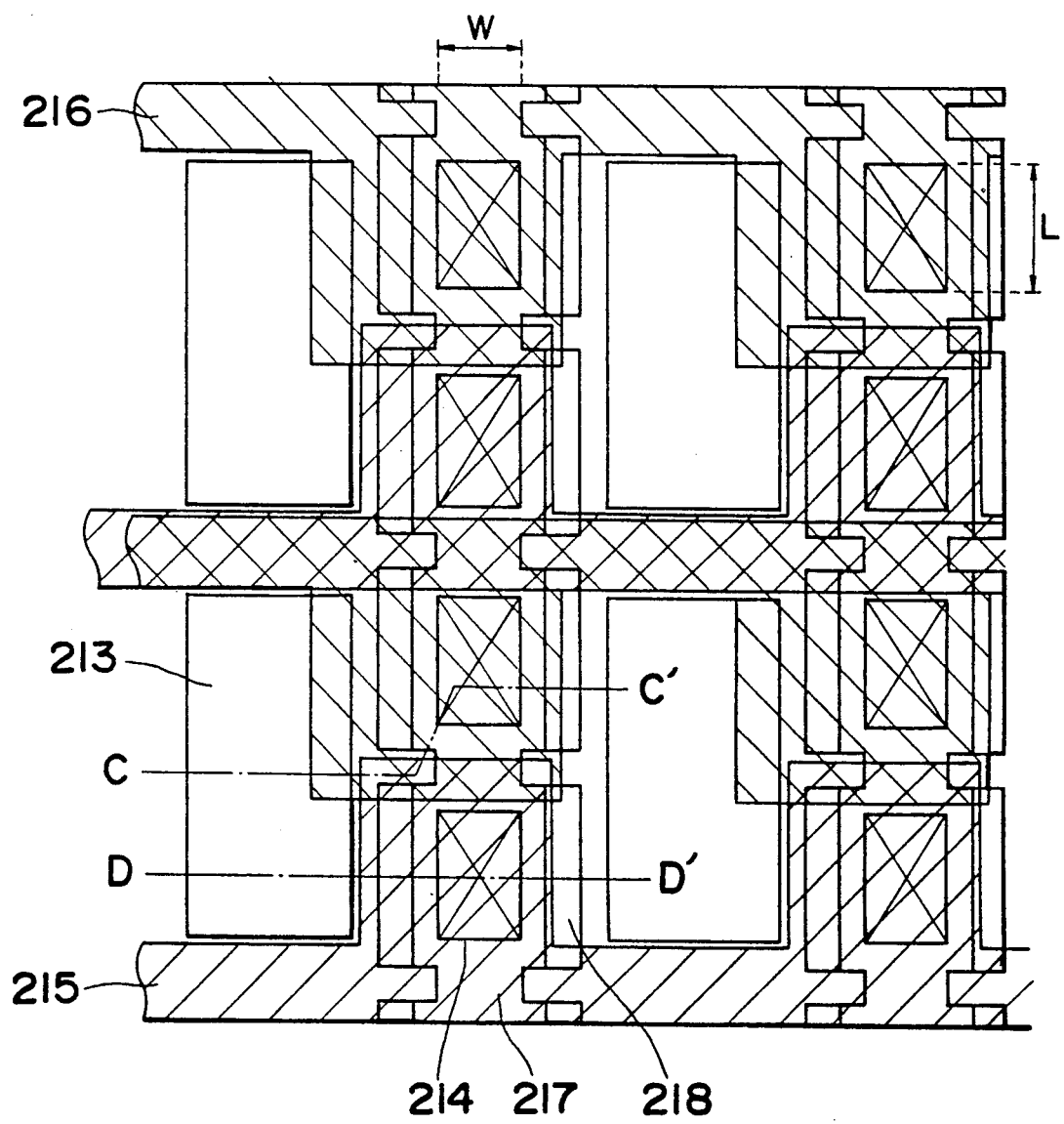
FIG. 4(b) is a plan view of the light receiving part in FIG. 4(a)
Figure 4C:
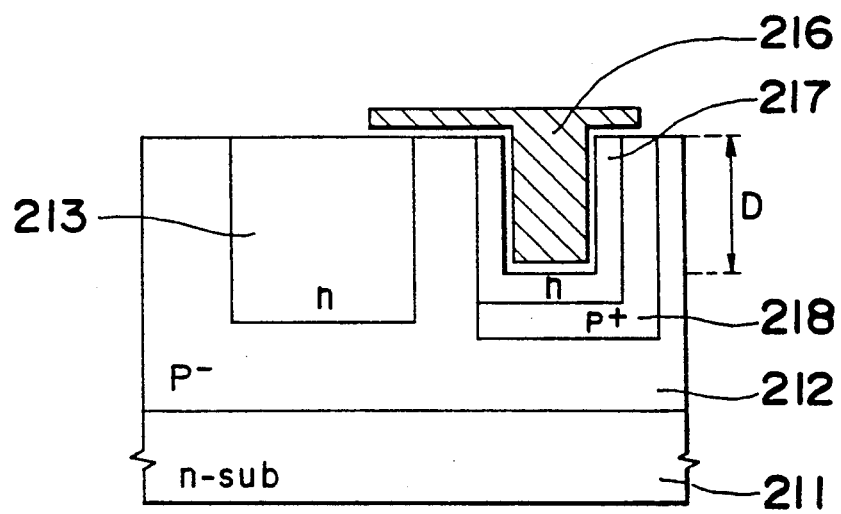
FIG. 4(c) is a cross sectional view taken along the lines C—C' in FIG. 4(b)
Figure 4D:
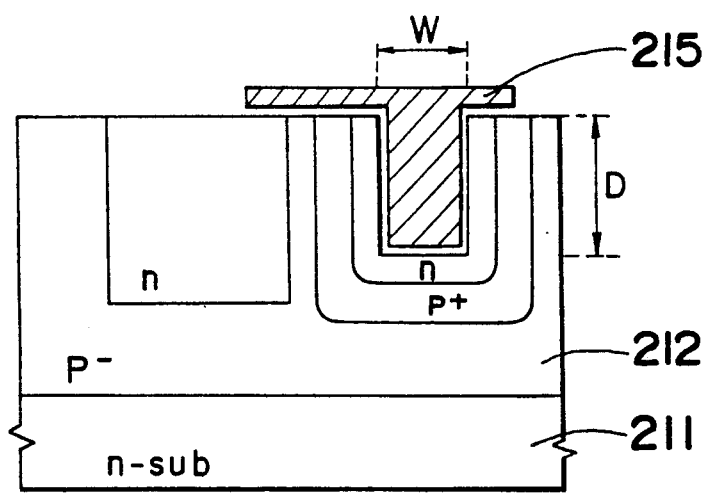
FIG. 4(d) is a cross sectional view taken along the lines D—D' in FIG. 4(b)
Figure 4E:
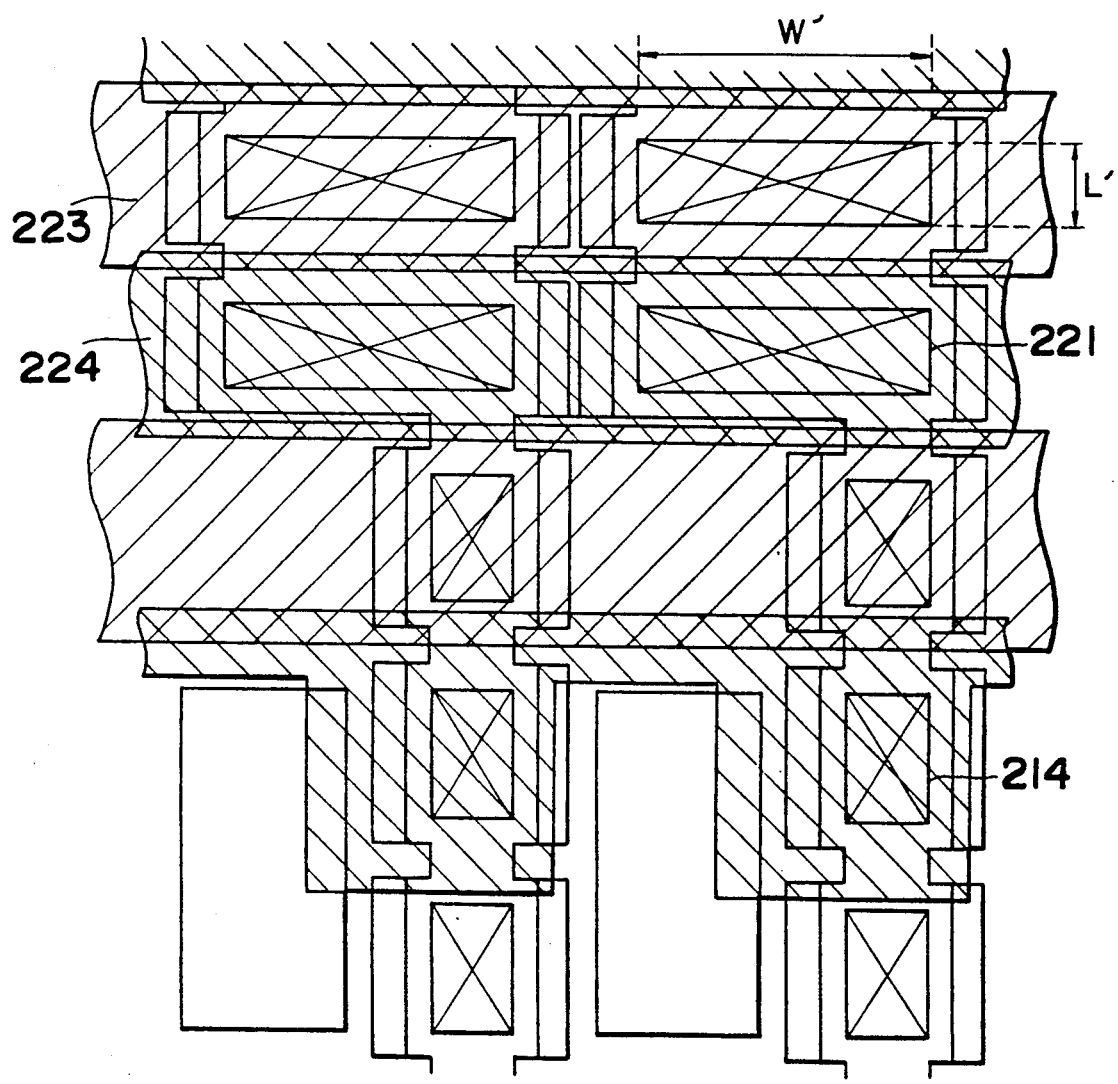
FIG. 4(e) is a plan view from the light receiving part to the charge storing part in FIG. 4(a).

In FIGS. 4(b), 4(c) and 4(d), there is formed a photoelectric conversion region 201 by a pn junction photo diode formed on an n conductivity type region 213 on the surface of the p-conductivity region 212. The vertical CCD 302 is provided by the trench hole type CCD shown in FIG. 3(n), 3(o), 3(p). In FIGS. 4(b), 4(c) and 4(d), the vertical CCD region 302 is formed in such a manner that a plurality of trench holes 214 are juxtaposed in the charge transfer direction with sizes L, W and the depth D and there are formed first electrodes 215 and second electrodes 216 of polysilicon, by burying polysilicon in the respective trench holes 214. An n conductivity type region 217 used as the charge transfer channel is formed around each trench hole and the outside region, p+ conductivity type region 218 is formed as the channel stop.

Figure 4F:
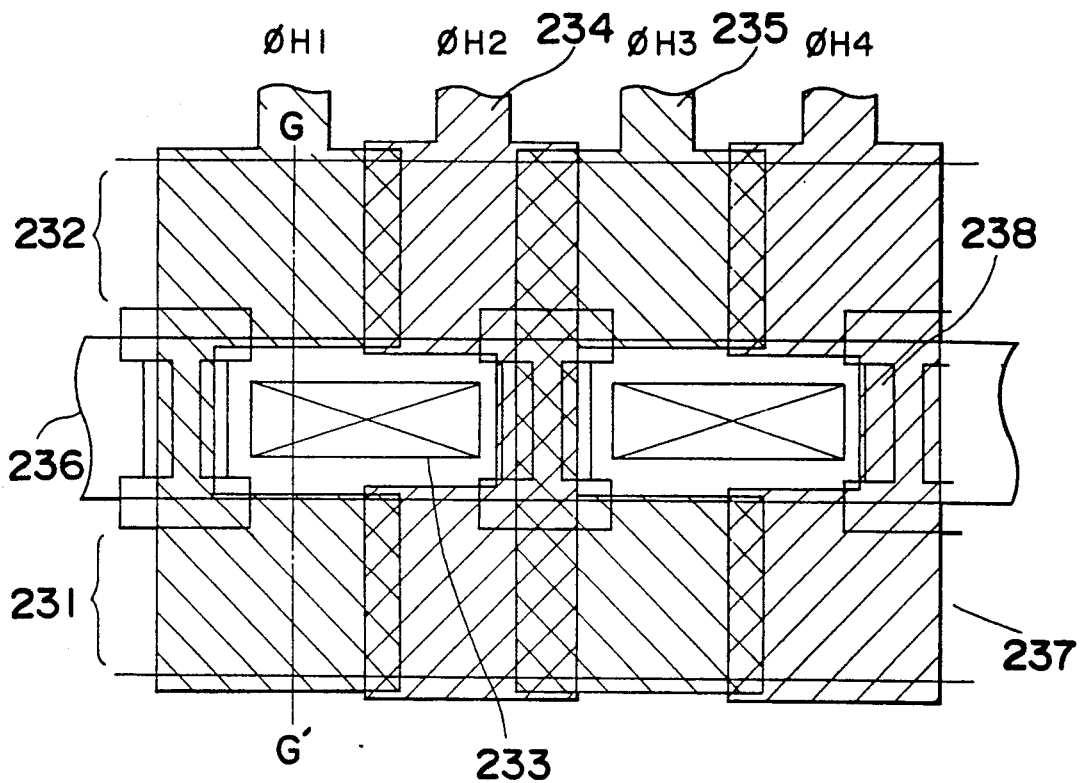
FIG. 4(f) is a plan view of the 2 channel horizontal CCD device.
Figure 4G:
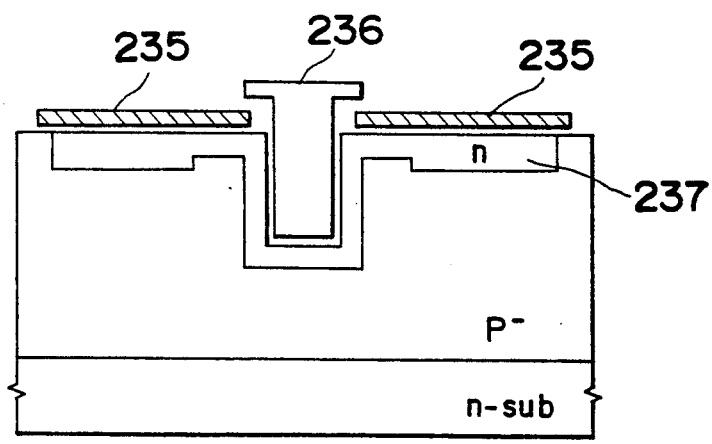
FIG. 4(g) is a cross sectional view taken along the lines G—G' in FIG. 4(f)

FIGS. 4(f) and 4(g) show the structure of the 2 channel horizontal CCDs in which there is formed a trench hole 233 for transferring the charge between the first horizontal CCD region 231 and the second horizontal CCD region 232.

As the charge transfer region around the horizontal CCD and the vicinity of the trench hole there is formed n conductivity region 237, and as the channel stop region there is formed p+ conductivity type region 238. Moreover, as the charge transfer electrodes for the first and second horizontal CCDs 231 and 232, there are formed a first electrode 234 and a second electrode 235 each made of polysilicon. A third electrode 236 made of polysilicon is formed as the charge transfer electrode of the trench hole type charge transfer gate for coupling the first horizontal CCD region 231 and second horizontal CCD region 232.

The operation of the trench hole type charge transfer unit of the present embodiment is the same as the operation of the embodiment shown in FIGS. 3(a) to 3(p).

According to the present embodiment it becomes possible to provide a CCD device independent of the depth of the trench since any electrode working in the recess of the conventional trench groove type CCD is rendered unnecessary by the employment of the trench hole type CCD in the vertical CCD region.

FIGS. 5(a) to 5(k) show the production method of the semiconductor device shown in FIGS. 4(a) to 4(g). The process of the making the device is sequentially explained.

Figure 5A:
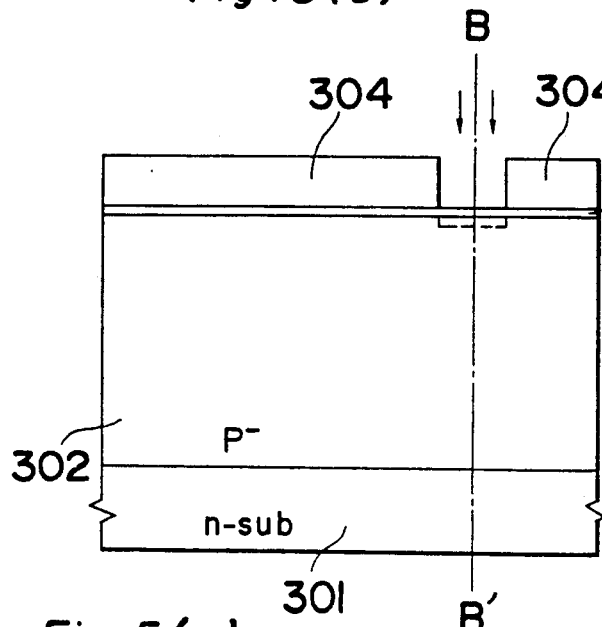
FIGS. 5(a) to 5(n) are cross sectional view showing the production processes of the device shown in FIG. 4.
Figure 5B:
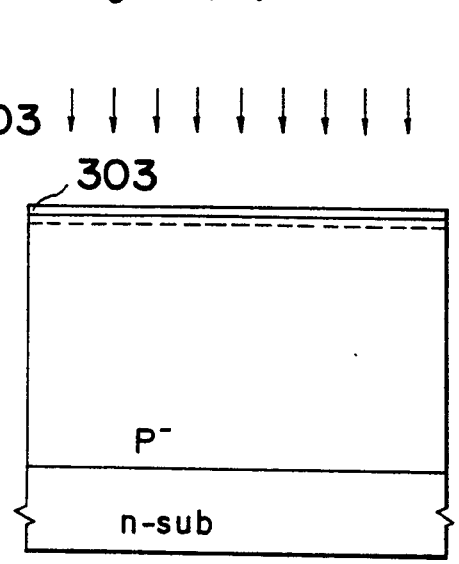

(1) As shown in FIGS. 5(a) and 5(b), after a protection oxide film 303 is formed on the surface of the p− type conductivity region 302 on the n conductivity type substrate 301, resist layers 304 are formed for forming a region for coupling the charge transfer regions, and n conductivity type impurities are ion injected.

Figure 5C:
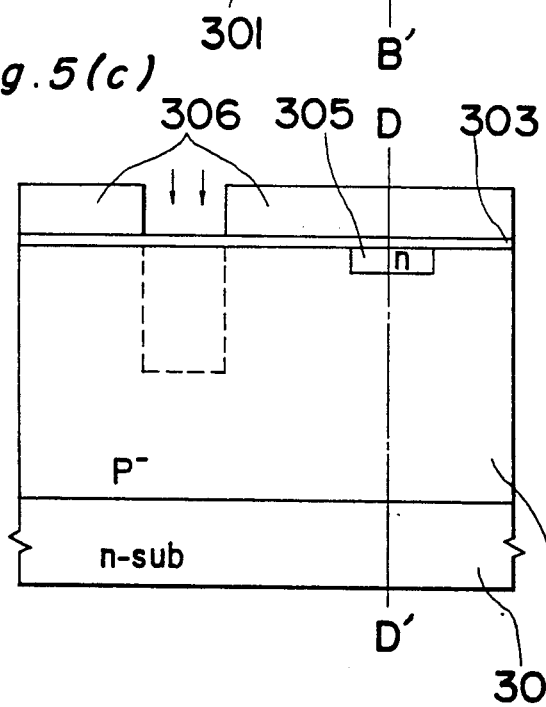
Figure 5D:
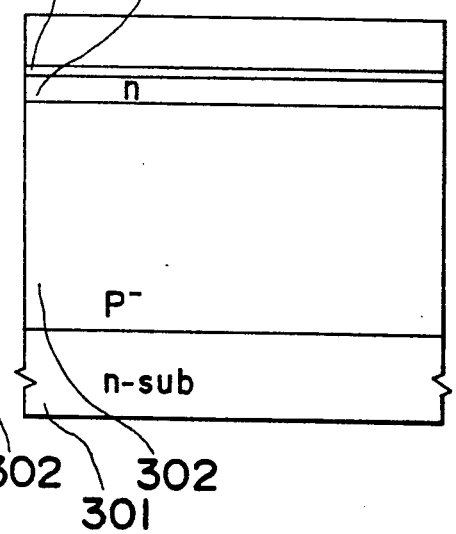

(2) After the ion implantation, by performing heat processing, the n conductivity type region 305 is formed as shown in FIG. 5(c) and 5(d). Thereafter resist layers 306 are formed for forming a photodiode, and n conductivity type impurities are ion injected.

Figure 5E:
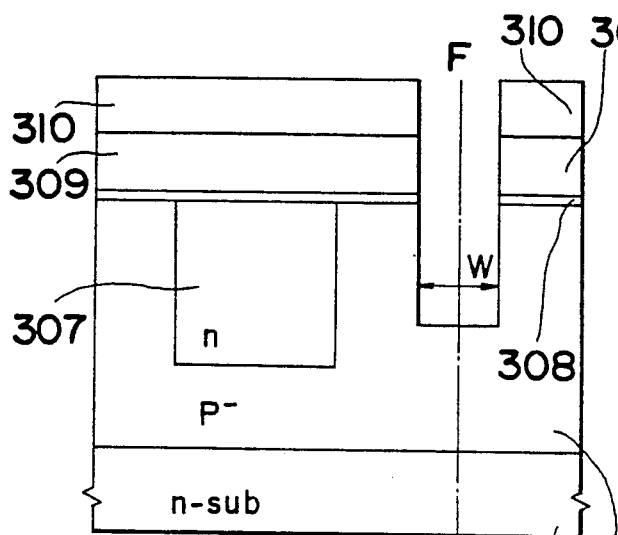
Figure 5F:
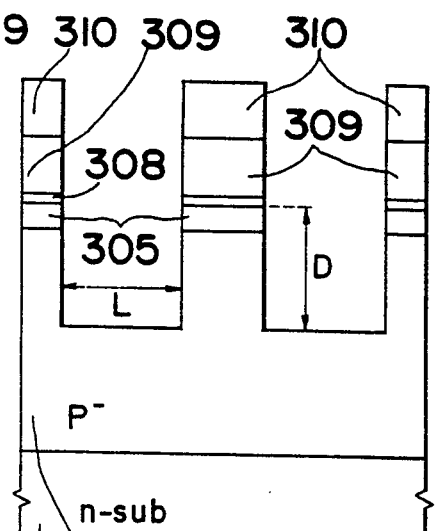

(3) By the heat processing after the ion implantation the n conductivity type region 307 of the photodiode is formed as shown in FIGS. 5(e) and 5(f). Thereafter once the oxide film is removed and in turn nitride film 308 and PSG film 309 are formed in turn the resist 310 is formed, whereby a part of the nitride film 308 and a part of the PSG film 309 are removed. Then silicon is etched to form the trench hole of the sizes L and W and the depth D.

Figure 5G:
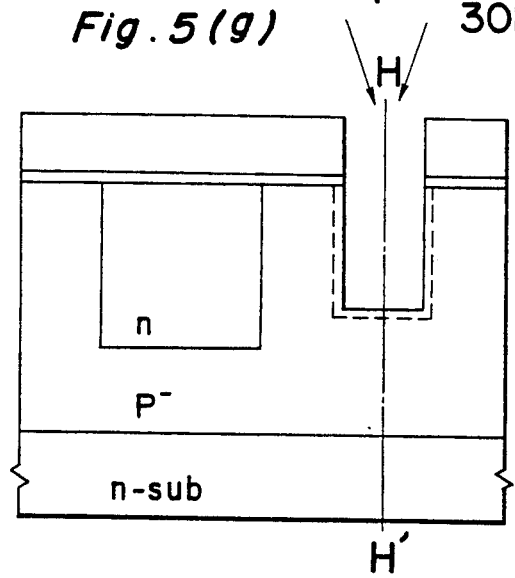
Figure 5H:
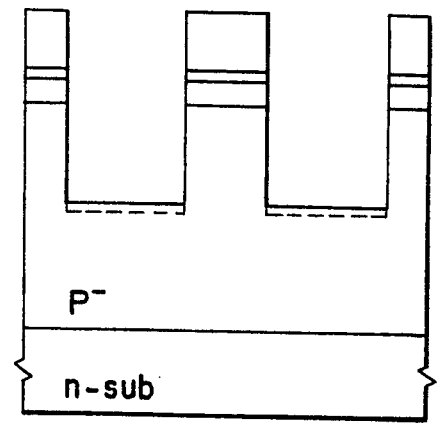

(4) As shown in FIGS. 5(g) and 5(h), p conductivity type impurities are ion implanted to the trench hole in the opposite directions each perpendicular to the charge transfer direction.

Figure 5I:
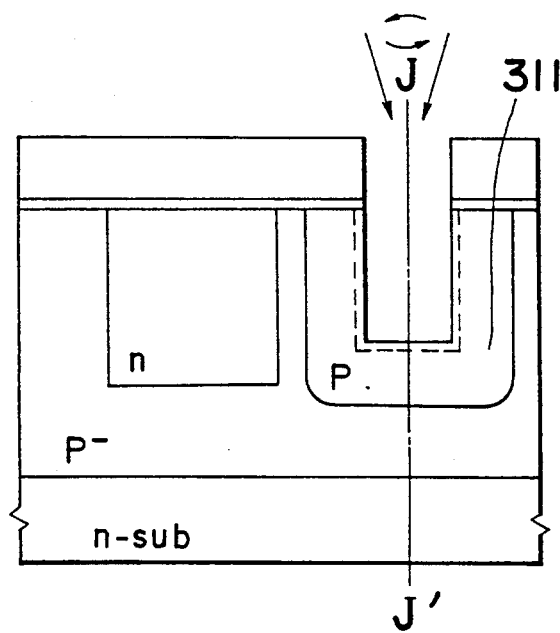
Figure 5J:
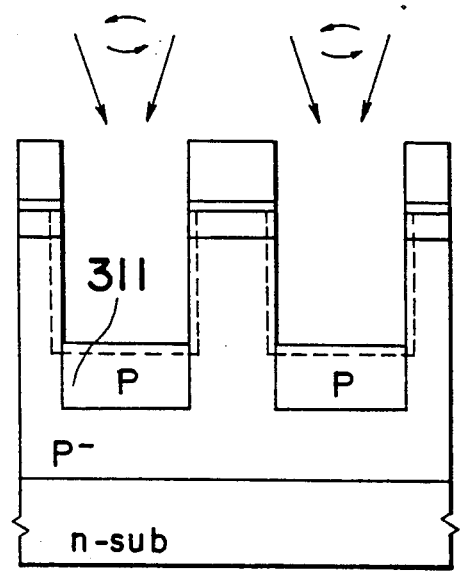

(5) By performing a heat processing after the ion implantation, as shown in FIGS. 5(i) and 5(j), the p+ conductivity type region 311 acting as the channel stop region is formed. Thereafter n conductivity type impurities are ion injected to the inside of the trench hole in a rotating slanted manner.

Figure 5K:
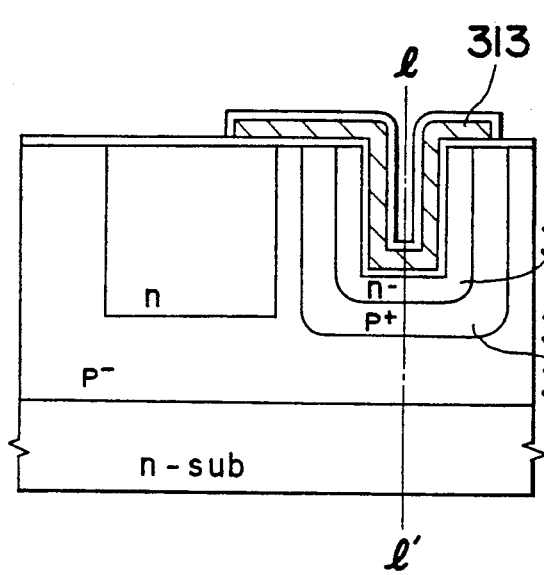
Figure 5L:
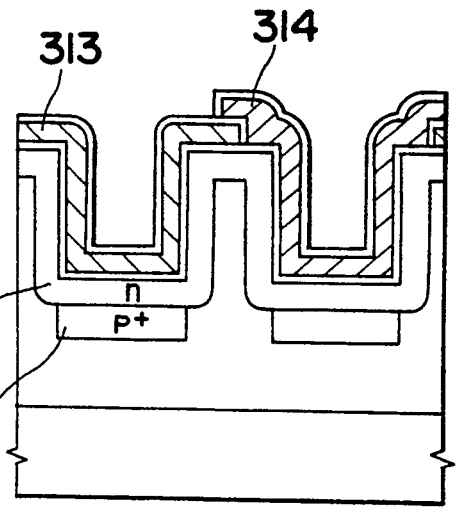

(6) By performing a heat processing after the ion implantation, as shown in FIGS. 5(k) and 5(l), the n conductivity type region 302 acting as the charge transfer region is formed. Then the gate oxide film of a three layer structure ($SiO_2/Si_3N_4/Si_xN_yO_z$) are formed on the inner surface of the trench hole, thereafter there is grown the first polysilicon electrode 215, and thereafter the surface except for the trench hole is etched using the resist to form the first transfer electrode 313. In a similar manner the second transfer electrode 314 is formed.

Figure 5M:
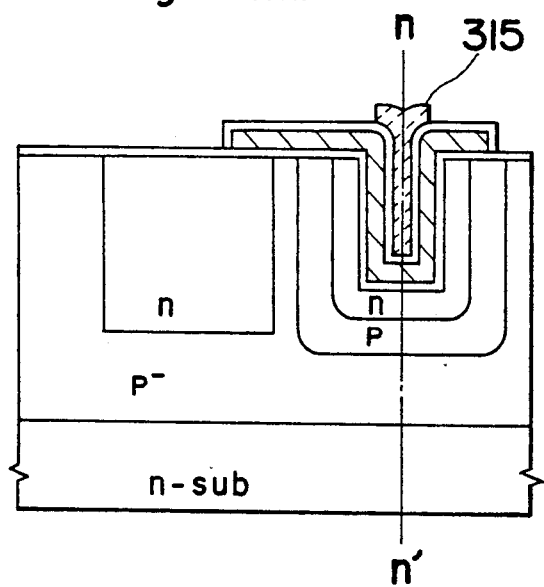
Figure 5N:
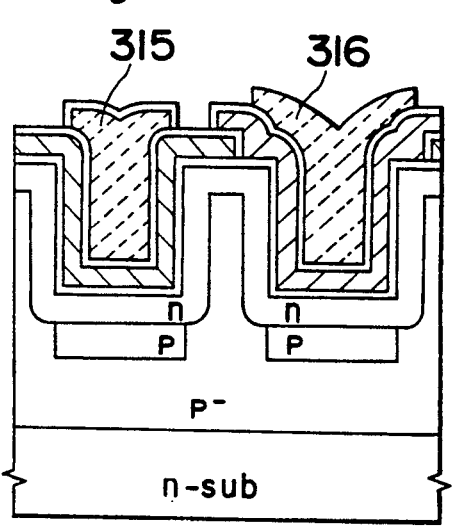

As shown in FIGS. 5(m) and 5(n), it is important for practical purposes to conduct the respective processes mentioned above during forming the electrodes 313, 314 considering burying polysilicon layers 315, 316 in the trench holes.

By the production processes mentioned above, it is possible to provide CCD devices having the trench holes without any works of the electrodes in the trench holes.

Although the trench holes disclosed in the embodiments are rectangular shape having the sizes L and W, they may be formed in other desired shapes such as circular shapes, oblong shapes and polygon shapes. Moreover, the trench hole may be any reversed conical shape in place of elongated cubic shape.

The charge transfer region around the vicinity of the trench hole may be formed by solid phase diffusion or vapor phase diffusion in place of the slanted ion implantation process of the impurities.

As mentioned above, according to present invention, there are arranged a plurality of trench holes in the substrate in the charge transfer direction and one kind of the charge transfer electrode is provided in the form of an electrode buried in the trench hole, and there may be provided semiconductor device independent of the depth of the trench hole. In addition, by realizing the manufacturing process without bearing any load in the process, it is possible to select the depth of the trench hole which defines the dynamic range property of the charge transfer.

What is claimed is:

1. A semiconductor device comprising:
   a continuously formed first semiconductor layer of a first conductivity type;
   a plurality of trench holes formed in a line at regular intervals entirely within said continuously formed first semiconductor layer;
   each of said trench holes having a charge transfer electrode;
   characterized in that, when a transfer voltage is applied to adjacent charge transfer electrodes formed in two adjacent trench holes, depletion regions formed around the trench holes are overlapped.

2. A semiconductor device comprising:
   a continuously formed first semiconductor layer of a first conductivity type;
   a plurality of trench holes formed in a line at regular intervals entirely within said continuously formed first semiconductor layer;

a second semiconductor layer of a second conductivity type covering the circumference of a side wall of each trench hole and continuously covering a surface of a region between two adjacent trench holes;

each of said trench holes having a charge transfer electrode.

3. A semiconductor device comprising:

a first semiconductor layer of a first conductivity type;

a photoelectric conversion region of a second conductivity type formed in a matrix shape in said first semiconductor layer;

a plurality of trench holes formed in a line at regular intervals in a column direction of the matrix of said photoelectric conversion region in said first semiconductor layer;

a second semiconductor layer of a second conductivity type covering a circumference of a side wall of each trench hole and continuously covering a surface of a region between two adjacent trench holes;

a third semiconductor layer of the first conductivity type formed on the side wall of each trench hole facing said photoelectric conversion region using an oblique ion injecting method, each of said trench holes having a charge transfer electrode.

* * * * *